United States Patent
Brandenburg et al.

(10) Patent No.: US 7,227,758 B2
(45) Date of Patent: Jun. 5, 2007

(54) PRINTED CIRCUIT BOARD ASSEMBLY WITH INTEGRATED CONNECTOR

(75) Inventors: Scott D. Brandenburg, Kokomo, IN (US); Thomas A. Degenkolb, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 285 days.

(21) Appl. No.: 10/624,063

(22) Filed: Jul. 21, 2003

(65) Prior Publication Data

US 2005/0018410 A1    Jan. 27, 2005

(51) Int. Cl.
- H05K 7/02    (2006.01)
- H05K 7/06    (2006.01)
- H05K 7/08    (2006.01)
- H05K 7/10    (2006.01)

(52) U.S. Cl. .................. 361/780; 361/774; 361/775; 361/814

(58) Field of Classification Search ........ 361/768–775, 361/813, 823–825; 439/66, 76.1; 257/666
See application file for complete search history.

(56) References Cited

U.S. PATENT DOCUMENTS

| | | | |
|---|---|---|---|
| 4,713,634 A * | 12/1987 | Yamamura ................. 333/245 |
| 4,908,933 A | 3/1990 | Sagisaka et al. |
| 4,949,225 A | 8/1990 | Sagisaka et al. |
| 5,022,870 A | 6/1991 | Sakamoto et al. |
| 5,220,491 A | 6/1993 | Sugano et al. |
| 5,422,782 A * | 6/1995 | Hernandez et al. ...... 361/306.2 |
| 5,434,750 A * | 7/1995 | Rostoker et al. ............ 361/784 |
| 5,603,620 A | 2/1997 | Hinze et al. |
| 5,774,342 A | 6/1998 | Brandenburg et al. |
| 5,889,316 A * | 3/1999 | Strobel et al. .............. 257/659 |
| 6,011,319 A | 1/2000 | Kelly et al. |
| 6,054,754 A * | 4/2000 | Bissey ........................ 257/666 |
| 6,062,903 A | 5/2000 | Hawes et al. |
| 6,323,840 B1 * | 11/2001 | Steinbrunner ............... 345/161 |
| 6,535,396 B1 | 3/2003 | Degenkolb et al. |
| 6,579,105 B2 * | 6/2003 | Keyser ......................... 439/66 |
| 6,652,292 B2 * | 11/2003 | Pratt et al. ................. 439/76.1 |

FOREIGN PATENT DOCUMENTS

| | | |
|---|---|---|
| DE | 19615994 | 10/1997 |
| JP | 7307636 | 11/1995 |

OTHER PUBLICATIONS

EP Search Report Dated Mar. 7, 2007.

* cited by examiner

*Primary Examiner*—Tuan Dinh
(74) *Attorney, Agent, or Firm*—Jimmy L. Funke

(57) ABSTRACT

A printed circuit board (PCB) assembly includes a PCB and a first integrated conductive bus structure extending from a first edge of the PCB. The PCB connects a plurality of electronic components and includes a plurality of conductive layers, each separated by a non-conductive layer. The first integrated conductive bus structure includes a first portion that extends from the first edge of the PCB and which forms a plurality of electrically separate contacts of a connector. A second portion of the bus structure is integrated within the PCB and couples each of the contacts to at least one conductive trace of the PCB through plated holes.

19 Claims, 6 Drawing Sheets

PRINTED CIRCUIT BOARD ASSEMBLY WITH INTEGRATED CONNECTOR

TECHNICAL FIELD

The present invention generally relates to a printed circuit board assembly and, more particularly, a printed circuit board assembly with an integrated connector.

BACKGROUND OF THE INVENTION

In a typical electronic assembly, a printed circuit board (PCB) is utilized to mount various electronic components, which are interconnected to perform desired functions. In such assemblies, a through hole or surface mounted connector has been utilized to connect the PCB of the assembly to an external system via, for example, a bus, such as an automotive bus. When a through hole connector is utilized, all layers of the PCB are consumed in the area in which the connector is located. In certain products that have a relatively small PCB total surface area, the connector may take up forty percent or more of the total surface area. When the PCB is a high density PCB, the cost of the PCB surface area consumed by the connector can be relatively expensive. In addition, traditional product connectors tend to increase the overall product size, mass and cost of such an electronic assembly. This is particularly true in the automotive industry, where the trend has been to miniaturize electronic control assemblies.

As is well known, miniaturization of electronic assemblies has been facilitated by flip chips and micro ball grid arrays (uBGAs), among other device packages. As is also well known, a typical traditional product connector consists of pins staked in a plastic shroud. The pins of such a connector may be through hole soldered to a PCB using a wave or selective soldering process. As discussed above, such a through hole or surface mounted connector may take up a relatively large area of a miniaturized electronic assembly, making such area unavailable for surface mounted components.

What is needed is a technique to connect a printed circuit board (PCB) assembly to an external bus that reduces the amount of PCB area required for the connection.

SUMMARY OF THE INVENTION

An embodiment of the present invention is directed to a printed circuit board (PCB) assembly that includes a PCB and a first integrated conductive bus structure extending from a first edge of the PCB. The PCB connects a plurality of electronic components and includes a plurality of conductive layers, each separated by a non-conductive layer. The first integrated conductive bus structure includes a first portion that extends from the first edge of the PCB and which forms a plurality of electrically separate contacts of a connector. A second portion of the bus structure is integrated within the PCB and couples each of the contacts to at least one conductive trace of the PCB through plated holes.

According to another embodiment of the present invention, the assembly is overmolded with a plastic material with a portion of the plastic material forming a connector housing that surrounds the contacts of the connector.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
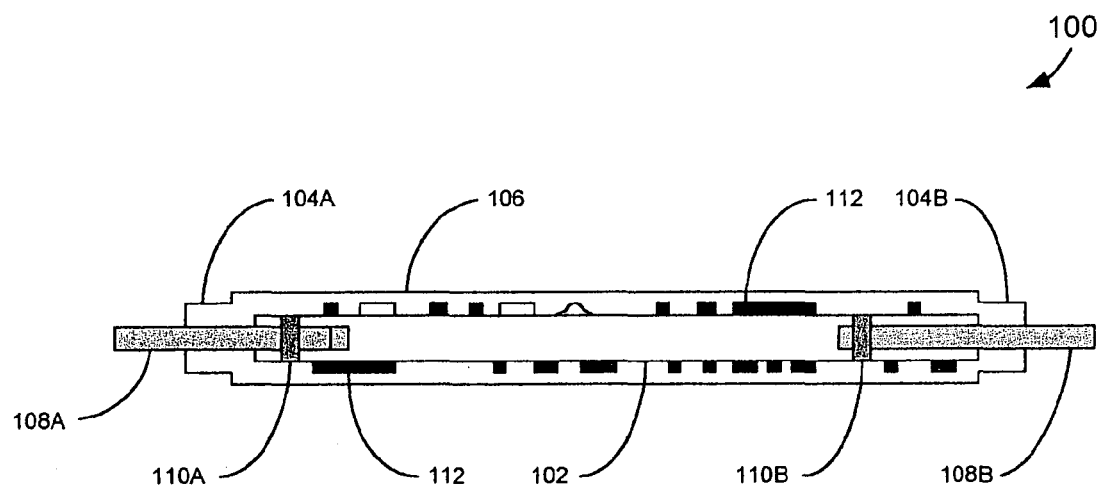
FIG. 1 is a cross-sectional view of a printed circuit board (PCB) assembly, according to one embodiment of the present invention.

According to the present invention, a segmented copper bus is integrated within a printed circuit board (PCB) to provide integral connector pins. It should be appreciated that copper alloys or other electrically conductive materials may be used to form the integral connector pins. The PCB is then overmolded to provide a PCB assembly with an integral connector housing formed around the connector pins. A connector designed in this manner reduces the amount of PCB surface area required to connect the PCB assembly to an external bus, as the integrated connector does not consume surface area of the PCB. Further, according to another embodiment of the present invention, an inductive-capacitive (LC) filter network can be readily implemented in a PCB assembly. Thus, a PCB assembly according to the present invention directly interconnects to a product harness/bus thereby eliminating the need for a separate surface mounted connector header.

According to one embodiment of the present invention, a stamped copper plate is utilized as an internal bus. The stamped copper plate provides a segmented leadframe that is laminated into a PCB stack, which incorporates the leadframe as an internal layer of a multi-layer PCB. The portion of the leadframe that extends from an edge of the PCB provides copper contacts, which are formed as connector pins/blades for the product connection system. The connector pins/blades are interconnected to conductive traces of the PCB by plated holes, i.e., vias. In the event that the connector pins/blades that extend from the edge of the PCB are interconnected internal to the PCB, the connector pins/blades may be separated by drilling or punching holes (i.e., segmenting holes) through the PCB in appropriate places to separate the connector pins/blades. According to another embodiment of the present invention, the PCB and at least a portion of the connector pins/blades are then overmolded to form a connector housing for the PCB assembly. Alternatively, the pins/blades of the PCB assembly may also be attached to another lead frame, by laser welding or other attachment process, and in this case the PCB assembly would act as a subassembly.

In yet another embodiment of the present invention, a portion of the PCB is removed to form an aperture (or the PCB may be formed with an aperture) and a ferrite block is placed over the connector pins/blades within the aperture that is formed in the PCB. In this embodiment, filter capacitors may then be located on a surface area of the PCB adjacent to the edge of the PCB from which the connector pins/blades extend. This provides a relatively compact LC network filter structure that generally reduces electromagnetic interference (EMI).

One advantage of the present invention is that layout and design of separate distinct connectors is no longer required, as the connectors are an integral part of the PCB assembly. Thus, a PCB assembly can generally be reduced in size and integration of an LC filter with the PCB assembly can reduce the total cost of a given subsystem. As an additional advantage, the manufacturing process may also be improved as it is not necessary to solder a connector to the PCB, which is especially advantageous in dual reflow manufacturing processes. As discussed above, PCB density can be increased as electronic components can be mounted on the PCB surface in the area in which the connector shrouds would have formerly resided. Further, PCB trace routing may be simplified (in that smaller vias may be used to connect the internal connector leads) and the freedom to locate vias is generally increased.

Systems that implement PCB assemblies according to the present invention are generally less expensive, as such PCB assemblies have fewer mechanical parts and require fewer manufacturing processing steps. Additionally, as the portion of the connector pins/blades that is located within the PCB is made of a thicker material, the PCB will, in general, have increased current carrying capacity for high current devices, such as field effect transistors (FETs). A PCB assembly designed according to the present invention will generally also have electromagnetic compatibility (EMC) advantages in that pins of traditional connectors more readily act as antennas, which pick up and radiate undesirable electromagnetic noise. Further, enhanced shielding is achieved as the connector is primarily located internal to the PCB.

With reference to FIG. 1, PCB assembly 100 includes a PCB 102 that has a plurality of integral connector pins 108A and 108B extending from opposite edges of the PCB 102. The pins 108A are connected to associated traces of the PCB 102 by vias (plated through holes) 110A and the pins 108B are connected to appropriate conductive traces of the PCB 102 by vias 110B. As is shown in FIG. 1, the PCB may include a plurality of electronic components 112 mounted on either side of the PCB 102. An overmold, for example, a plastic overmold, 106 may be utilized to environmentally seal the PCB 102 and may provide integral connector shrouds 104A and 104B for receiving a mating connector. Thus, the assembly 100 may be utilized in harsh environments as the PCB 102 is protected from environmental conditions by the overmold 106. In addition to carrying signals, the integral connector pins 108A and 108B may serve as integral heat sinks which carry heat away from the assembly 100.

Figure 1A:
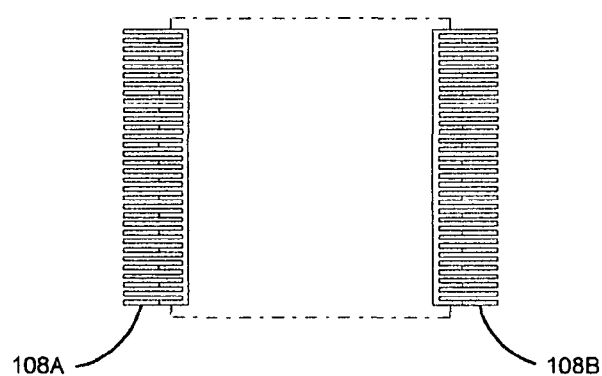
FIG. 1A is a perspective view of a segmented copper leadframe that provides connector pins for the PCB assembly of FIG. 1.
Figure 1B:
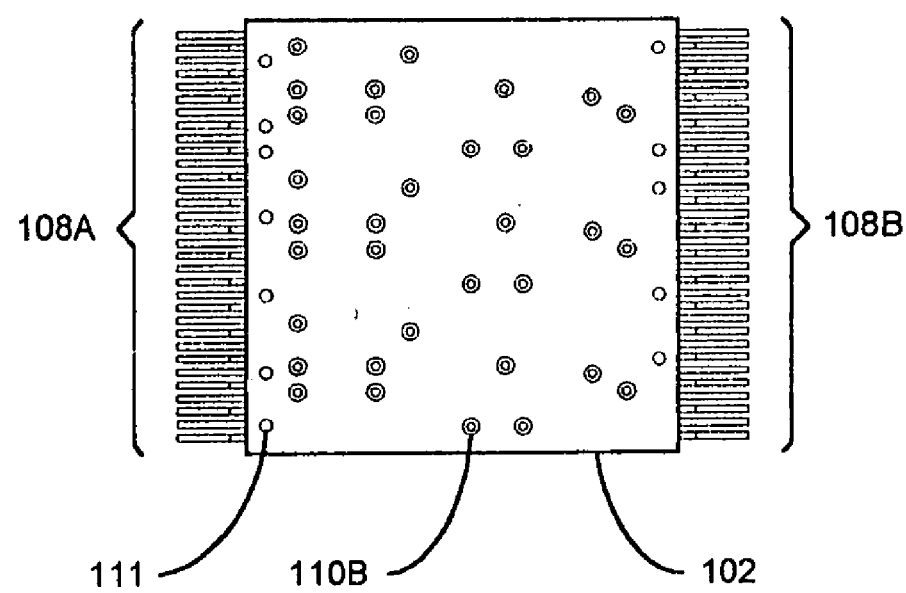
FIG. 1B is a perspective view of a PCB used in the PCB assembly of FIG. 1, prior to overmolding and further detailing non-plated segmenting holes and plated through holes.
Figure 1C:
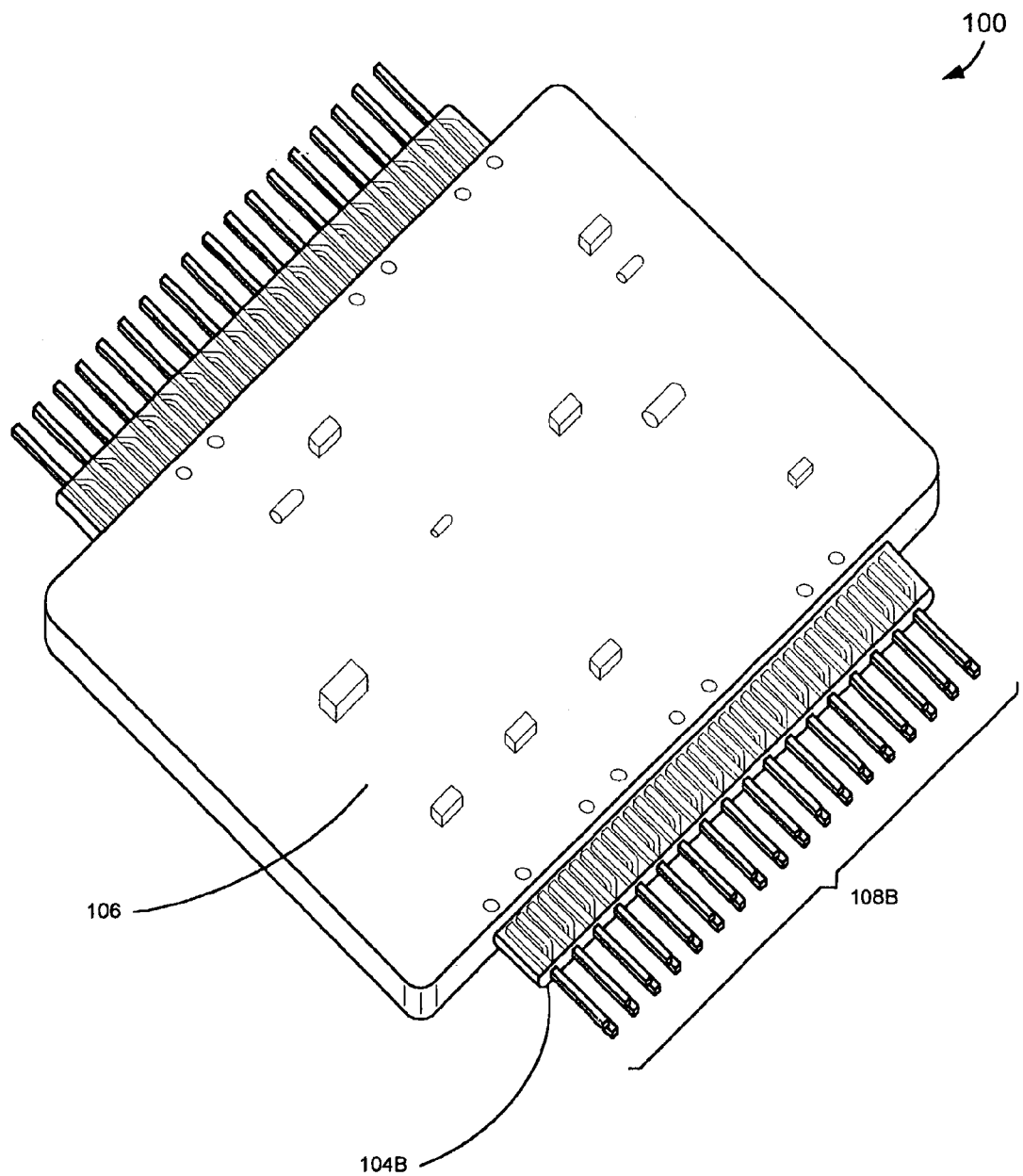
FIG. 1C is a perspective view of the PCB assembly of FIG. 1.

With reference to FIG. 1A, a pair of segmented copper leadframes 108A and 108B are shown in greater detail. FIG. 1B depicts the PCB 102 with the leadframes 108A and 108B incorporated within the PCB 102, prior to overmolding. FIG. 1B also depicts the PCB 102 including a plurality of plated holes 110B, which may be utilized to connect the integral connector pins 108B to conductive traces of the PCB. As previously discussed, non-plated segmenting holes 111 may be formed to separate the pins of the leadframe 108B, depending upon the construction of the leadframe 108B. That is, if the pins 108B are held, in a fixed relationship internal to the PCB 102, by one or more bus bars, the segmenting holes 111 may be drilled or punched to separate the pins of the leadframe 108B. FIG. 1C depicts the assembly 100, which includes the PCB 102 with an overmolding 106, which forms an integral connector shroud 104B for the pins 108B.

It should be appreciated that the pins may extend from multiple edges of the PCB 102 or may only extend from one edge of the PCB 102 and, in this configuration, may form a single in-line package (SIP) assembly. Such SIP assemblies may be preferred for various applications, such as ignition coil drivers, low and high side injection drivers and power supply circuits in sensors and power modules. Further, the SIP assemblies may be added to other PCB assemblies as a SIP subassembly. Assemblies that include connector pins that extend from one or both sides of the PCB assembly may also be desirable in other automotive modules, e.g., transmission control modules (TCMs), engine control modules (ECMs), and sensor and power modules.

Figure 2:
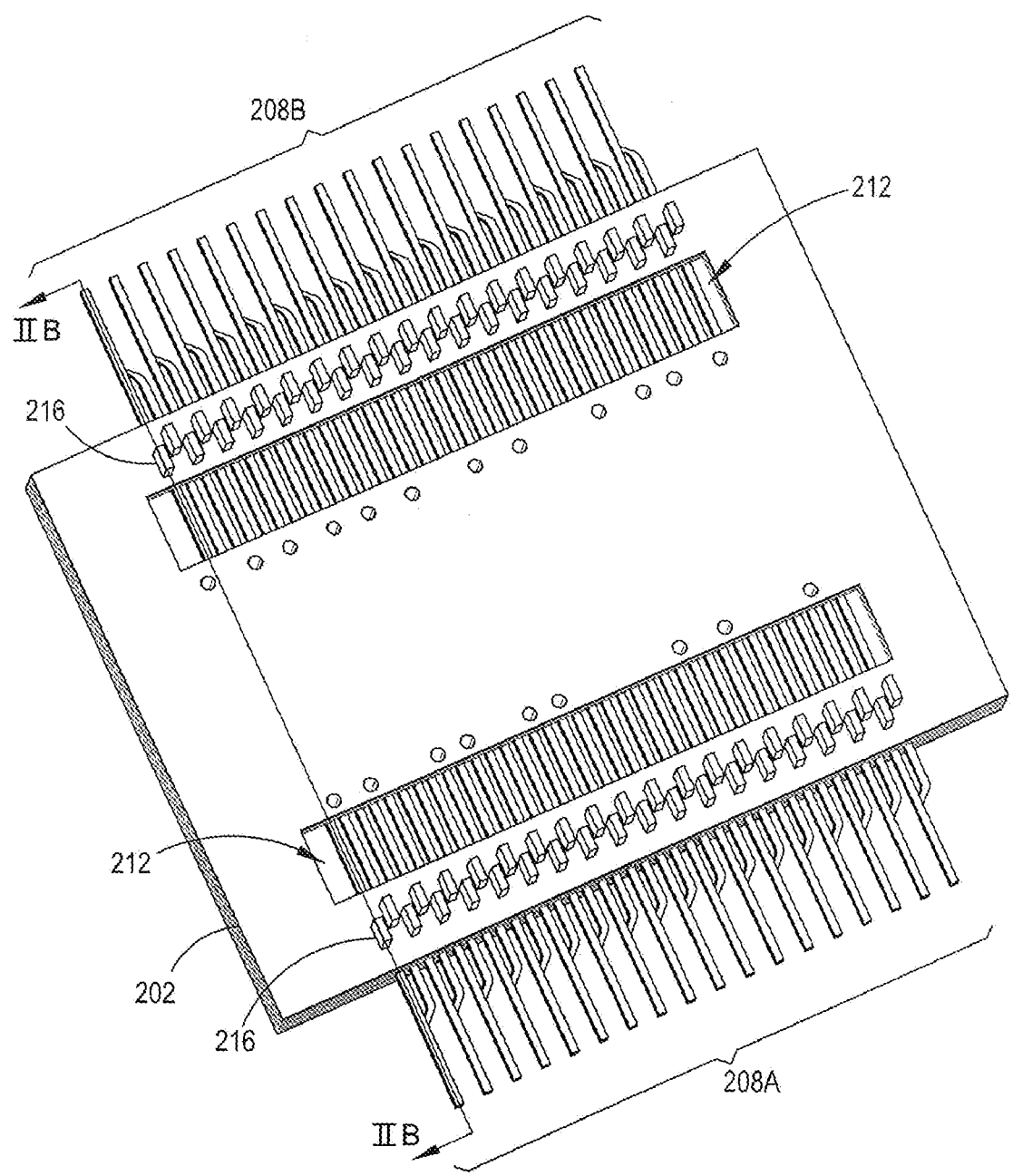
FIG. 2 is a perspective view of a PCB assembly, prior to overmolding, that is designed to receive integrated LC filtering, according to another embodiment of the present invention.
Figure 2A:
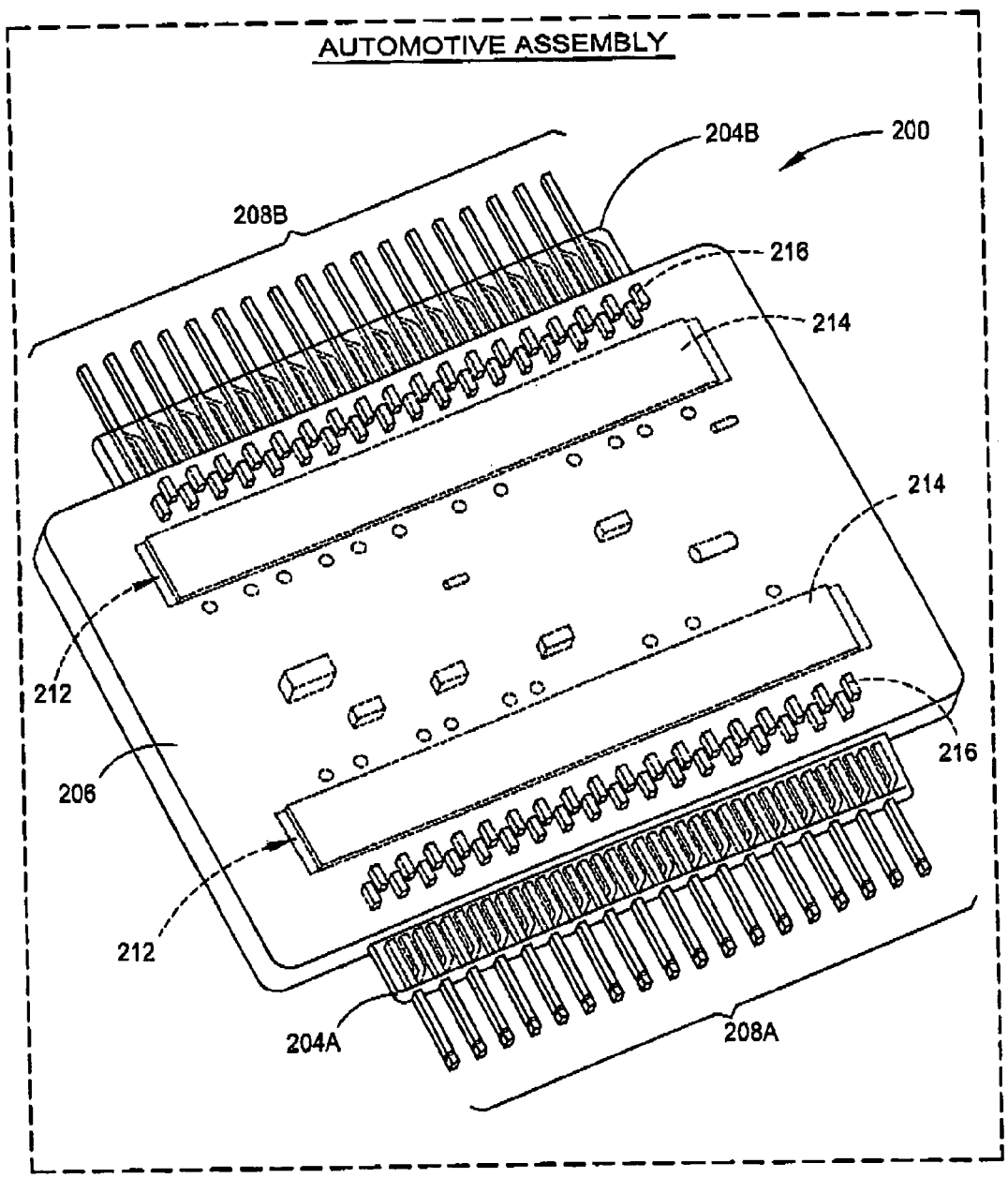
FIG. 2A is a perspective view of the PCB of FIG. 2, after overmolding and including integrated LC filtering, as incorporated in a PCB assembly.
Figure 2B:
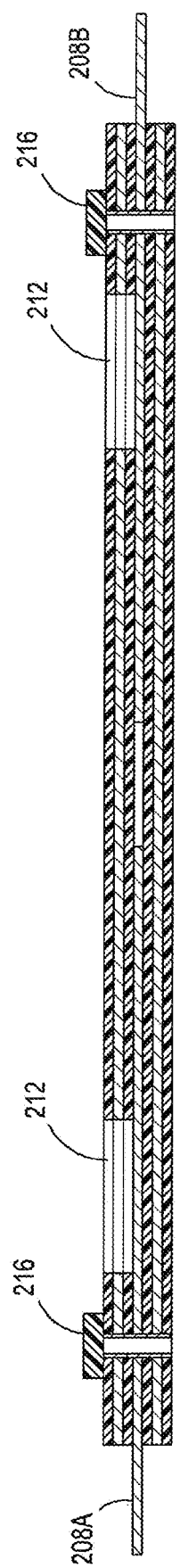
FIG. 2B is a cross-sectional view taken through line IIB—IIB of FIG. 2.

FIG. 2 depicts a PCB 202, as used in PCB assembly 200 (see FIG. 2A), with apertures 212 for receiving ferrite blocks 214 formed in the PCB 202. As is shown in FIG. 2A, the ferrite block 214, in combination with capacitors 216, form LC filters for the pins 208A. As is also shown in FIG. 2A, the ferrite block 214, in combination with capacitors 216, also form LC filters for the pins 208B. As compared to conventional LC filter techniques, the LC filter according to the present invention is generally more readily implemented. For example, in commercially available assemblies, a ferrite block has been placed over connector pins of a connector, which has generally required a retainer to retain the ferrite block and potting to seal the ferrite block to a case, which encloses the assembly. In other assemblies that have included an edge connector that extends from an edge of a PCB, the connector pin has required soldering to the PCB. A PCB assembly of the present invention can be used for an automotive assembly that is one of an engine control module, a transmission control module, and a sensor and power module.

Accordingly, a PCB assembly has been described that includes a connector that is integral to the PCB. The integral connector provides a lower profile and generally increases reliability in that fewer solder joints are required. Further, according to one embodiment of the present invention, an integral LC filter allows for filtering at a cost which is generally lower than that provided by current filter techniques. Additionally, the PCB assembly according to the present invention allows for fewer manufacturing steps in that no wave soldering is required of the connector and no final assembly is required as the assembly is overmolded. Further, less PCB real estate is required which allows designers to reduce the size of automotive modules as smaller vias can be used for connecting the connector pins to conductive traces of the PCB. Also, vias for connecting the pins can generally be more readily located. In sum, a PCB assembly according to the present invention obviates the need for a separate connector header, which generally reduces system level cost and, in PCB assemblies that include integrated LC filters, increases EMI performance as shorter signal lines tend to reduce the effect of the connector pins acting as radiating antennas.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A printed circuit board (PCB) assembly, comprising:
a printed circuit board (PCB) for connecting a plurality of electrical components, the PCB including a plurality of conductive layers each separated by a non-conductive layer; and
a first integrated conductive bus structure extending from a first edge of the PCB, wherein a first portion of the bus structure that extends from the edge of the PCB forms a plurality of electrically separate contacts of a connector and a second portion of the bus structure that is laminated into the PCB as an internal layer of the PCB couples each of the contacts to at least one conductive trace within the PCB through plated holes;
an aperture formed in the PCB adjacent the second portion of the bus structure, the aperture providing access to the second portion of the bus structure; and a filter block positioned within the aperture formed in the PCB, the filter block located adjacent to the second portion of the bus structure, the filter block providing inductive filtering for the contacts of the connector.

2. The assembly of claim 1, wherein the filter block is a ferrite material.

3. The assembly of claim 1, wherein the assembly is overmolded with a plastic material, and wherein a portion of the plastic material forms a connector housing that surrounds the contacts of the connector.

4. The assembly of claim 1, wherein the integrated conductive bus structure is made of copper.

5. The assembly of claim 1, further comprising:
a second integrated conductive bus structure extending from a second edge of the PCB, wherein a first portion of the second integrated conductive bus structure that extends from the second edge of the PCB forms a plurality of second electrically separate contacts of a second connector and a second portion of the second integrated conductive bus structure that is laminated into the PCB as an internal layer of the PCB couples each of the second electrically conductive contacts to at least one conductive trace within the PCB through different plated holes, and wherein the second edge is opposite the first edge.

6. The assembly of claim 2, further including:
a plurality of capacitors positioned on at least one surface of the PCB assembly adjacent to the edge of the PCB from which the connector extends and adjacent the filter block, wherein at least one of the capacitors is coupled between ground and each one of the contacts of the connector.

7. The assembly of claim 3, wherein the connector housing formed by the overmolded plastic material is shaped to receive a body of a mating connector.

8. A printed circuit board (PCB) assembly, comprising:
a printed circuit board (PCB) for connecting a plurality of electrical components, the PCB including a plurality of conductive layers each separated by a non-conductive layer; and
a first integrated conductive bus structure extending from a first edge of the PCB, wherein a first portion of the bus structure that extends from the edge of the PCB forms a plurality of electrically separate contacts of a connector and a second portion of the bus structure that is laminated into the PCB as an internal layer of the PCB couples each of the contacts to at least one conductive trace within the PCB through plated holes, and wherein the assembly is overmolded with a plastic material and a portion of the plastic material forms a connector housing that surrounds the contacts of the connector;
an aperture formed in the PCB adjacent the second portion of the bus structure, the aperture providing access to the second portion of the bus structure; and a filter block positioned within the aperture formed in the PCB, the filter block located adjacent to the second portion of the bus structure, the filter block providing inductive filtering for the contacts of the connector.

9. The assembly of claim 8, wherein the filter block is a ferrite material.

10. The assembly of claim 8, wherein the connector housing formed by the overmolded plastic material is shaped to receive a body of a mating connector.

11. The assembly of claim 8, wherein the integrated conductive bus structure is made of copper.

12. The assembly of claim 8, further comprising:
a second integrated conductive bus structure extending from a second edge of the PCB, wherein a first portion of the second integrated conductive bus structure that extends from the second edge of the PCB forms a plurality of second electrically separate contacts of a second connector and a second portion of the second integrated conductive bus structure that is laminated into the PCB as an internal layer of the PCB couples each of the second electrically conductive contacts to at least one conductive trace within the PCB through different plated holes, and wherein the second edge is opposite the first edge.

13. The assembly of claim 9, further including:
a plurality of capacitors positioned on at least one side of the assembly and adjacent the filter block, wherein at least one of the capacitors is coupled between ground and each one of the contacts of the connector.

14. A printed circuit board (PCB) assembly for an automotive assembly, comprising:
a printed circuit board (PCB) for connecting a plurality of electrical components, the PCB including a plurality of conductive layers each separated by a non-conductive layer;
an integrated conductive bus structure extending from a first edge of the PCB, wherein a first portion of the bus structure that extends from the edge of the PCB forms a plurality of electrically separate contacts of a connector and a second portion of the bus structure that is integrated within the PCB couples each of the contacts to at least one conductive trace within the PCB through plated holes, and wherein the assembly is overmolded with a plastic material and a portion of the plastic material forms a connector housing that surrounds the contacts of the connector; and
a filter block positioned within an aperture formed in the PCB approximate the integrated bus structure, the aperture providing access to the second portion of the bus structure, the filter block providing inductive filtering for the contacts of the connector.

15. The assembly of claim 14, wherein the filter block is a ferrite material.

16. The assembly of claim 14, wherein the connector housing is shaped to receive a body of a mating connector.

17. The assembly of claim 14, wherein the integrated conductive bus structure is made of copper.

18. The assembly of claim 14, wherein the automotive assembly is one of an engine control module, a transmission control module and a sensor and power module.

19. The assembly of claim 15, further including:
a plurality of capacitors positioned on at least one side of the assembly and adjacent the filter block, wherein at least one of the capacitors is coupled between ground and each one of the contacts of the connector.

* * * * *